US006262498B1

(12) United States Patent
Leiber

(10) Patent No.: US 6,262,498 B1
(45) Date of Patent: Jul. 17, 2001

(54) ELECTROMAGNETIC DRIVE MECHANISM

(76) Inventor: Heinz Leiber, Theodor-Heuss-Strasse 34, Oberriexingen (DE), D-71739

( * ) Notice: Subject to any disclaimer, the term of this patent is extended or adjusted under 35 U.S.C. 154(b) by 0 days.

(21) Appl. No.: 09/381,781

(22) PCT Filed: Mar. 24, 1998

(86) PCT No.: PCT/EP98/01709

§ 371 Date: Nov. 4, 1999

§ 102(e) Date: Nov. 4, 1999

(87) PCT Pub. No.: WO98/42957

PCT Pub. Date: Oct. 1, 1998

(30) Foreign Application Priority Data

| | | |
|---|---|---|
| Mar. 24, 1997 | (DE) | 197 12 056 |
| Mar. 24, 1997 | (DE) | 197 12 055 |
| Sep. 20, 1997 | (DE) | 197 41 571 |

(51) Int. Cl.[7] .......... H02K 41/00; H02K 33/00; H02K 7/06; H01L 9/04; F16K 31/02

(52) U.S. Cl. .......... 310/12; 310/15; 310/24; 123/90.11; 251/129.1; 251/129.16; 251/129.18; 335/274

(58) Field of Search .......... 310/12, 14, 15, 310/17, 20, 23, 24, 28, 30, 31, 34; 123/188.4, 188.15, 188.2, 90.1, 90.11, 90.15; 251/129.01, 129.02, 129.1, 129.16, 129.18; 335/270, 273, 274

(56) References Cited

U.S. PATENT DOCUMENTS

| | | | | |
|---|---|---|---|---|
| 5,005,534 | | 4/1991 | Washizu et al. | 123/52 M |
| 5,005,553 | | 4/1991 | Washizu et al. | 123/572 |
| 5,048,471 | | 9/1991 | Takii et al. | 123/52 MV |
| 5,117,213 | * | 5/1992 | Kreuter et al. | 335/219 |
| 5,131,624 | * | 7/1992 | Kreuter et al. | 251/129.18 |
| 5,161,494 | | 11/1992 | Brown, Jr. | 123/90.11 |
| 5,224,683 | * | 7/1993 | Richeson | 251/30.01 |
| 5,548,263 | * | 8/1996 | Bulgatz et al. | 335/274 |
| 5,720,468 | * | 2/1998 | Morinigo | 251/129.1 |
| 5,941,201 | * | 8/1999 | Shimizu et al. | 123/90.11 |

FOREIGN PATENT DOCUMENTS

| | | |
|---|---|---|
| 6 41 845 | 2/1937 | (DE) . |
| 2 038 675 | 8/1970 | (DE) . |
| 2 317 246 | 4/1973 | (DE) . |
| 2 334 211 | 7/1973 | (DE) . |
| 3031354 A1 | 4/1982 | (DE) . |
| 3208348 A1 | 12/1982 | (DE) . |
| 33 13 284 A1 | 10/1984 | (DE) . |
| 3508768 A1 | 10/1985 | (DE) . |
| 36 16 540 | 11/1987 | (DE) . |
| 3802836 A1 | 8/1989 | (DE) . |
| 195 11 880 A1 | 10/1995 | (DE) . |
| 195 34 959 A1 | 3/1996 | (DE) . |
| 195 06 566 A1 | 8/1996 | (DE) . |
| 44 30 324 C1 | 10/1996 | (DE) . |
| 196 28 860 A1 | 1/1998 | (DE) . |
| 1 471 537 | 9/1973 | (GB) . |
| 2 088 137 | 11/1980 | (GB) . |
| WO 97/17561 | 5/1997 | (WO) . |

* cited by examiner

*Primary Examiner*—Nestor Ramirez
*Assistant Examiner*—Dang Dihn Le
(74) *Attorney, Agent, or Firm*—Woodbridge & Associates, P.C.; Richard C. Woodbridge

(57) ABSTRACT

An electromagnetic drive is described that exhibits two electromagnets (2, 3) situated opposite one another and an armature (10) between them that can be moved back and forth. The armature (10) is held in an intermediate position by elastic forces and brought into a terminal position by the power of the electromagnets (2, 3). The armature (10) is mounted using a torsion spring (6) and at least one drive together with its bearings forms a single structural unit.

32 Claims, 7 Drawing Sheets

ELECTROMAGNETIC DRIVE MECHANISM

BACKGROUND OF THE INVENTION

1. Field of the Invention

The invention concerns an electromagnetic drive.

2. Description of Related Art

A drive having the characteristics of a superordinate concept is, for example, known from the description in EP 0 043 42 6 b1. A problem in such drives, particularly when they are used for the purpose of actuating valves in internal combustion engines is heat discharge from the magnet coils. It is known that this problem can be eliminated by the use of costly water or oil baths. Furthermore, the familiar solutions exhibit unresolved problems such as, for example, closed installation unit with electrical connection and adjustment of the magnetic system to residual air gap.

De 36 16 540 a1 describes an electromagnetic drive for a valve, in which the drive is incorporated into a structural unit. The armature is, in this case, supported by a roller bearing. In addition, this solution requires a torque spring [torsion spring] with a transmission lever external to the structural unit, which is then acted upon by the drive. In this case the result is considerable mass to be moved, which necessarily imposes the requirement of high performance on the drive.

SUMMARY OF THE INVENTION

The purpose of the invention is to provide the solution of mounting the armature as friction-free as possible and to create an easy-to-install assembly.

This solution to the problem is described herein and in the claims.

A unit that can be pre-tested is created by the invention that, with its application as a valve drive for a variety of motor types as standard, can be employed as a modular installation module.

With a further development of the invention, it is cost-effected to incorporate two drives into one structural unit. If, when doing this, the two drive are mounted on a common foundation or base, the problem of heat elimination is satisfactorily solved by imbedding the coils in the foundation or base. A fully testable component can be created, that is connected to the outside by way of a common plug. In the case of the invention the torsion spring can be elongated, because the entire width of the unit can be utilized.

Furthermore, the torsion spring can be pre-mounted using the valve actuation and armature using a carrier plate. Satisfactory adjustment of the magneto system with elimination of all tolerances is possible, particularly in the case where a mechanical stop system is used that firmly holds the armature in the terminal position without electromagnetic excitation. Furthermore, the magnets can be adjusted for residual air gap and fastened using screws or bolts relative to the magnet armature. The subordinate claims describe other design extensions of the invention.

With the various operational temperatures, for example, cold start, warm running, steady-state condition, repeat start the components involved in heat transfer such as the cylinder block, valves and their actuation have different expansions with different behavior over time. They thus have, in turn, an affect on the armature position; that is, residual air gap in the closed valve condition, in which the magneto system is effective. The different residual air gaps mean overhead in adjustment control and higher electrical performance consumption at greater air gaps. With the appropriate selection of materials this change can be kept to a minimum.

Design examples of the invention are elaborated using the drawing.

DETAILED DESCRIPTION OF THE INVENTION

Figure 1:
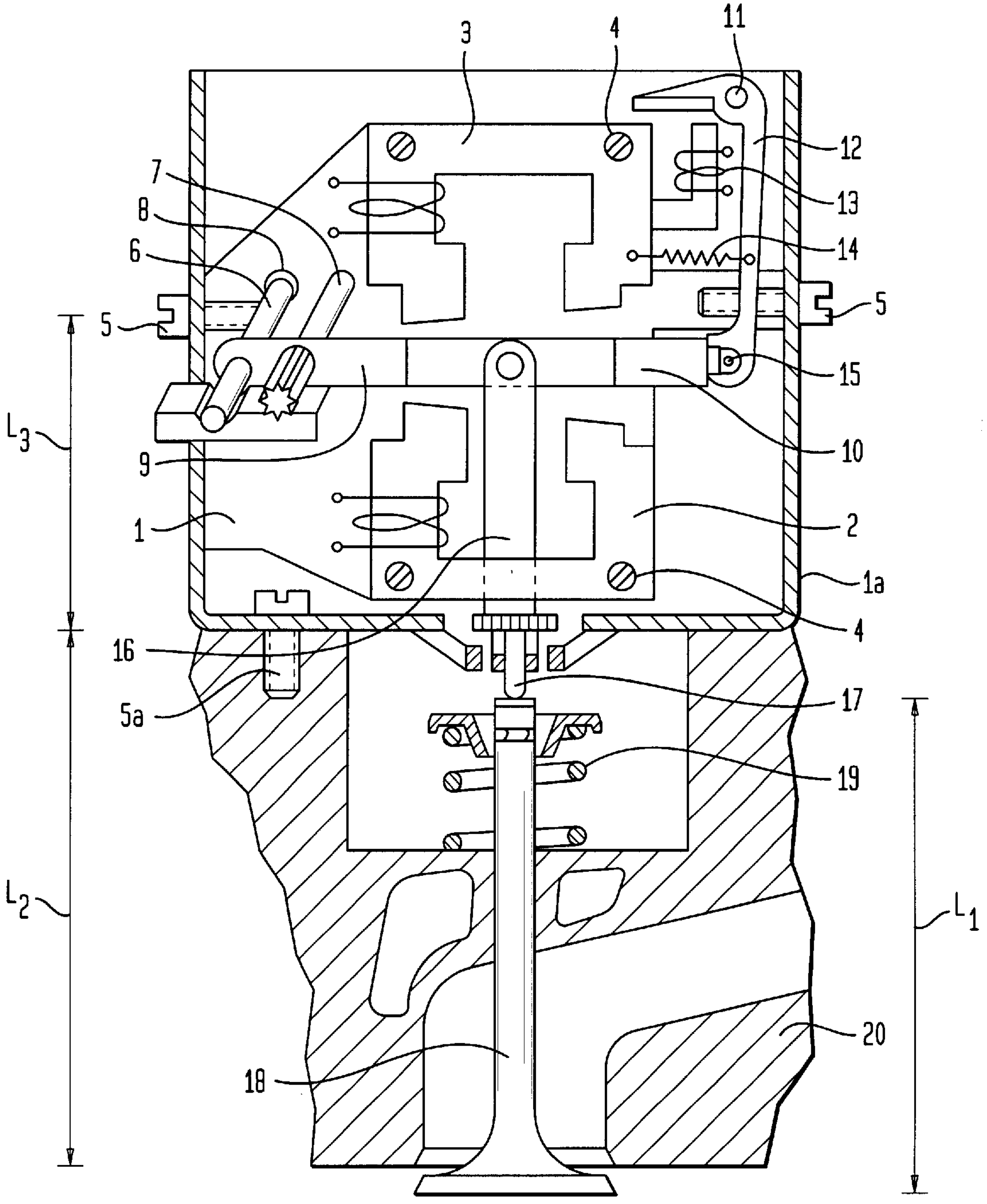
FIG. 1: a foundation or base with two drives mounted on it; shown in lateral view together with an actuated valve.

In FIG. 1 a foundation or base is identified using (1). In the illustration in FIG. 1 essentially only one drive can be seen. The second drive lies behind it. The visible drive exhibits two electromagnets (2) and (3) whose magnet yokes are attached to the foundation or base by screws (4). The coils of the electromagnets (2) and (3) are, for simplicity sake, shown merely schematically. The foundation or base (1) is fastened by screws (5) to a case or housing that is, in turn, fastened to the cylinder block (20) by screws **(5*a*)**.

An armature (10) is provided between the magnet poles of the electromagnets (2) and (3) and the armature is mounted movable on a torsion spring, for example, a torsion bar (6). The torsion bar (6) and the corresponding torsion bar (7) for the armature of the other drive are illustrated perspectively for emphasis. They are imbedded in the foundation or base, held unilaterally in it (the torsion bar 6 with 8) and at the other end, for example, mounted using, for example a needle bearing (not shown). An armature lever (9) is the connecting element between torsion bar (6) and armature (10).

At top right a stop or bosh system is provided that consists of a rocker (12) that can be tipped around an axis (11), a bosh magnet (13), a spring (14) and a stop roller (15) mounted on ball bearing, which clips at the end positions of the armature over or under, respectively, the armature and fixes it in the end positions. More will be said regarding the stop roller later. In the foundation or base a connection socket (not visible) for a plug is provided.

The armature (10) actuates a valve (18) against the energy of a spring (19) via an actuation rod (16) and a setting screw (17). Using the setting screw (17) the length of the actuator bar (16) can be changed. It serves the purpose of setting or adjusting the valve play at the armature position shown by the dashed lines and then closed valve (18). The spring (19) and the pre-stressing of the torsion bar (6) form the elastic forces, that bring the armature into the intermediate position without excitation of an electromagnet.

In FIG. 1, the dimensions are entered as 11 for the valve length, 12 for the valve block thickness, 13 for the distance of the axis of the torsion bar (6) from the valve block and 14 for the length of the actuator bar (16).

The materials; that is, the heat expansion coefficients of the valve block (2), of the valve (18), the actuator bar (16) and the case **(1*a*) are then selected in consideration of the lengths i1 to i4 and adjusted to each other in such a way that with a closed valve (18)** and despite different temperatures there is only minimal valve play in each case.

Figure 2:
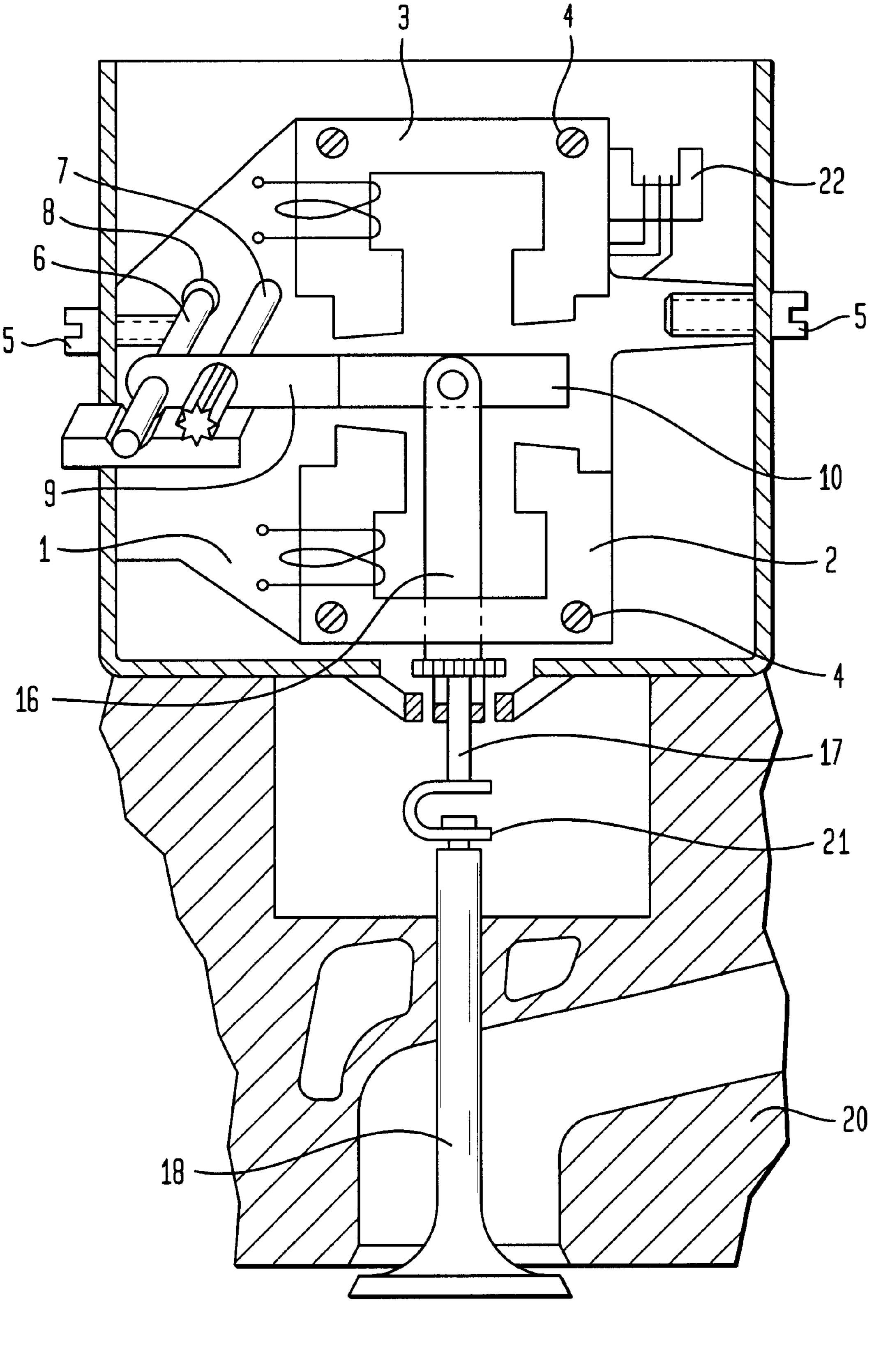
FIGS. 2 and 3: an exemplified embodiment similar to FIG. 1.

In FIG. 2, which differs only minimally from FIG. 1, the same parts are identified using the same reference symbols. In this instance, the stop or bosh system is absent; the adjusting screw (17) is connected to the valve shaft (18) using a valve spring (21). Said spring is an overstroke spring that can compensate to a particular degree the varying paths of the armature and the valve. In addition, the connection socket (22) discussed above is drawn into this figure. The reset force of the system is taken care of in both directions by the torsion spring.

Figure 3:
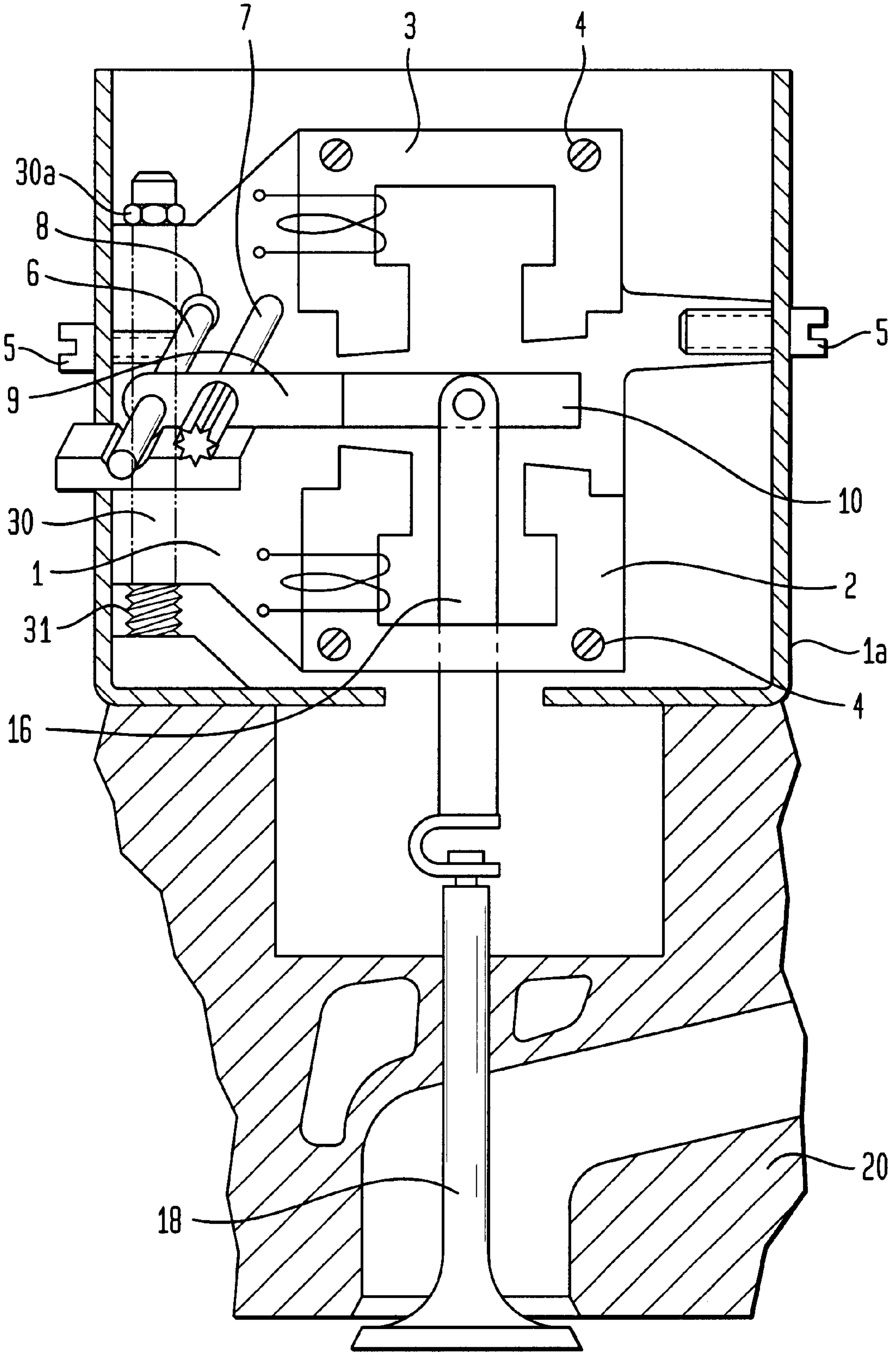

In FIG. 3 a possibility for height adjustment of the drive together with the spring bearing with respect to the case (1*a*) or the cylinder block is shown; it consists of a screw (30) and a cup [flat] spring (31).

The height adjustment feature serves in adjusting or setting the valve clearance. With the screw (5) loose, by tuning the nut (30*a*) of the screw (30) the foundation or base (1) is pressed more or less against the cup [flat] spring (31) and thus the gap (13) (FIG. 1) is varied.

As an alternative, it is also possible, that only the upper magnet is adjustable for the purpose of valve clearance or residual air gap adjustment. After correct setting or adjustment of valve clearance relative to a corresponding residual air gap the foundation or base [~~()~~] is firmly fastened to the case using the screw (5).

For the purpose of repositioning the upper magnet both the screw contrivance (30, 30*a*) mentioned above and a construction can be used, in which the magnet, corresponding to the armature construction, is mounted to be rotatable unilaterally about an axis using a lever. By turning around said axis the residual air gap and the valve clearance can be adjusted, since the relative gap between the poles of the magnet yokes situated opposite one another changes.

The displacement of the magnets is done, for example, against a spring tension using an eccentric cam or via a screw mechanism. For a more advantageous way to provide a permanent displacement, counterelements are provided that secure the cam or screw elements.

Figure 4:
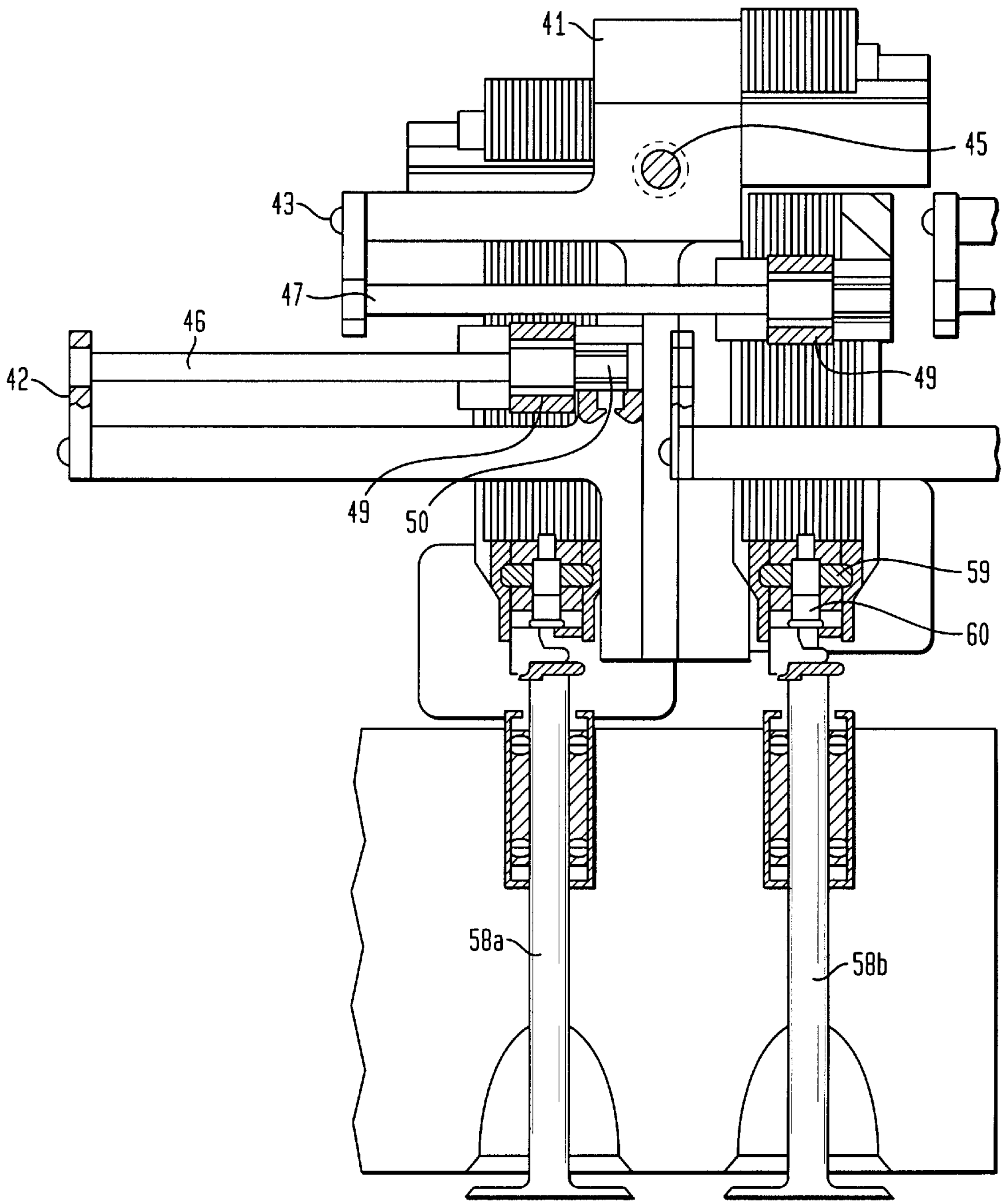
FIG. 4: an additional exemplified embodiment in another view.

In FIG. 4 the component with two drives for two valves (58*a*) and (58*b*) are shown in a view rotated 900 (compared to FIGS. 1 to 3). The foundation or base, which can be fastened to the case (not shown) by using the screws (45) (corresponding to 5), is identified by (41). The foundation or base (41) carries two carrier platen (42) and (43), at which one torsion bar (46) and (47) each is fastened. The carrier platen can be fastened to the foundation or base (41) using bolts or screws. Fastening of the torsion bar in the carrier plate can be achieved by using a form-locking connection; for example, a square or a serration connected to the torsion bar can be collapsed into the carrier plate. A welding; for example, a laser weld can be used. The connection of the torsion bars to the armature lever (49) can be done in a similar way. For the purpose of welding to the torsion bar, a metal bushing can be imbedded into the armature lever. Also visible here are the bracket (50) for the free ends of the torsion bars (46) and (47), which are particularly shown as needle bearings. Here, too, the valves (58) are coupled via an overstroke spring.

Figure 5:
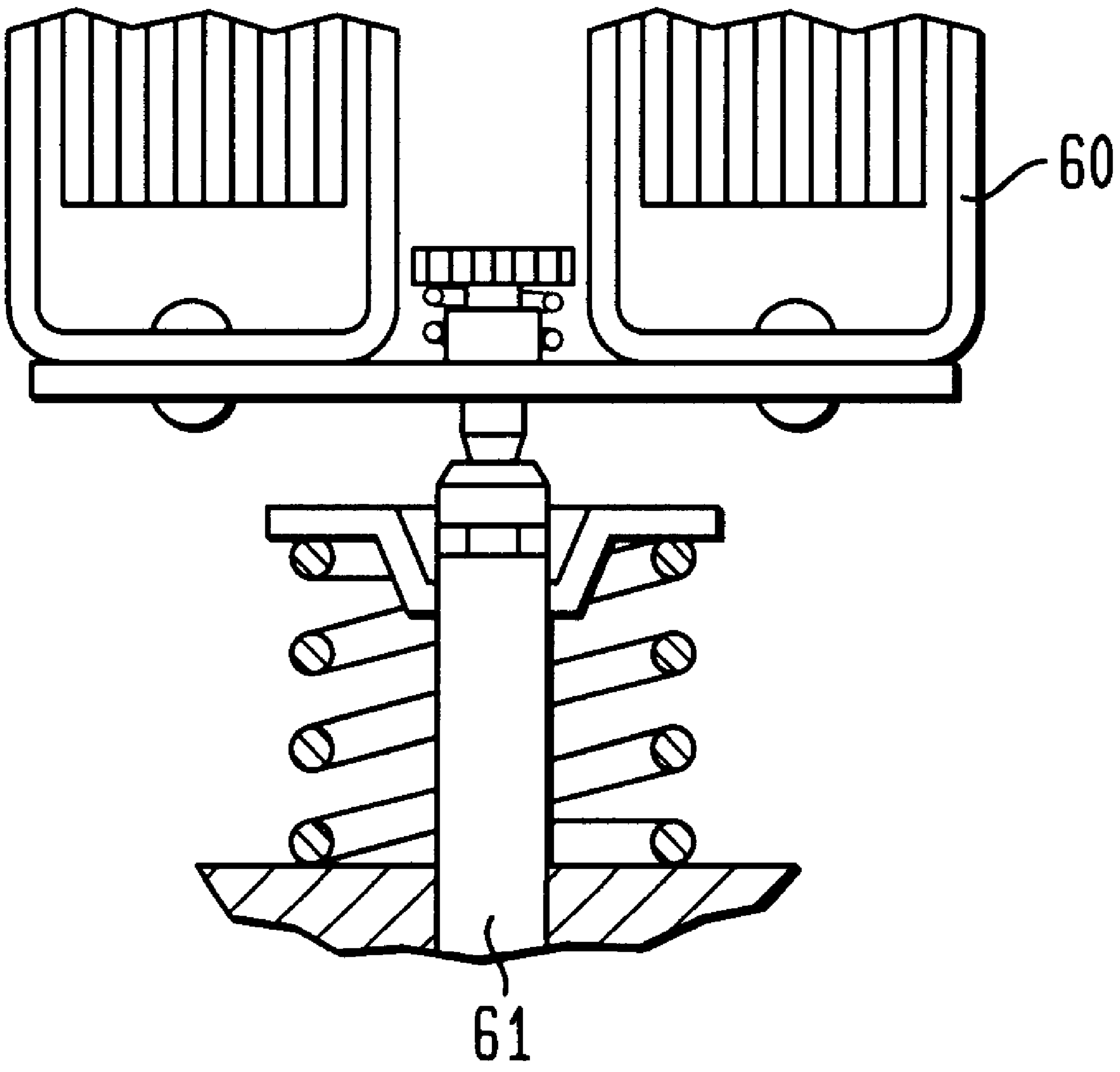
FIG. 5: a valve driven by two drives.

For actuation of a large valve (for example, in the case of 3-valve motors) the actuation rods (60) of two adjacent valves can act upon on valve shaft (61) (FIG. 5).

Figure 6:
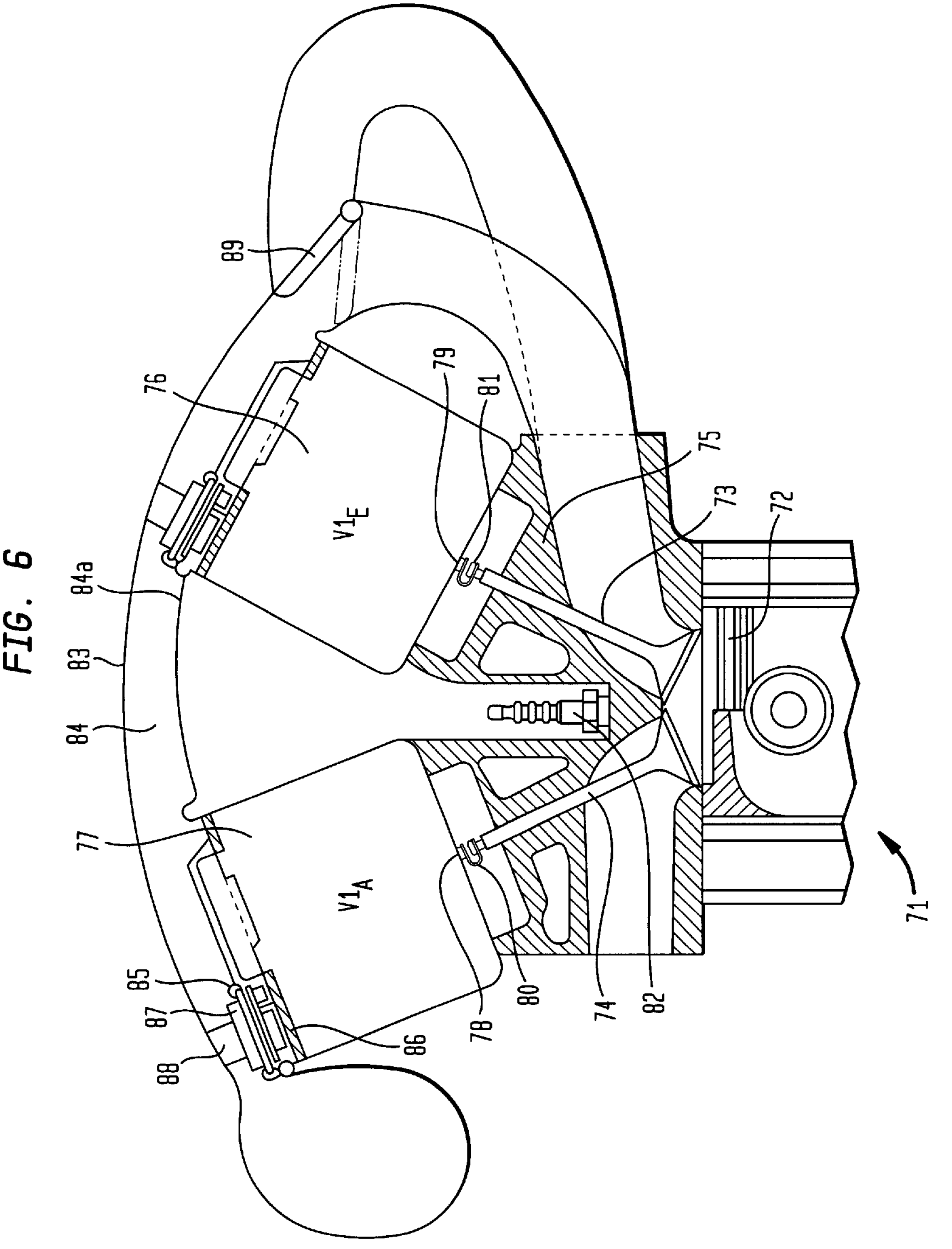
FIGS. 6 and 7: case designs.

In FIG. 6 a cylinder of an internal combustion engine is shown whose piston (72) is situated in the upper position. Shown are an inlet valve (73) and an exhaust valve (74) which are in the cylinder head (75). The valves (73) and (74) are driven by electromagnetic drives which are housed in the casings (76) and (77). The casings are fastened to the cylinder head (75) by screws (not shown). The drives exhibit, as shown above, two electromagnets and an armature mounted on a torsion bar using a connector. The torsion bar is sized in such a manner that the armature stops in an intermediate position without addressing an electromagnet. An actuation rod (78) and (79) is attached to the connector and the rod is connected to the valve stem (73) or (74) by way of an overstroke spring (80) and (81). Normally, the overstroke springs (80) and (81) provide a rigid coupling of the valve stem with the actuation rod (78) or (79). Only when the armature describes a larger stroke than can be accommodated by the valve does the spring effect occur.

The actuation rod, including the overstroke spring, extend out of the case floor. For augmented protection the parts preferably should not project out of the casing. The connection between the overstroke spring and the valve stem can be loosened: for example, if the overstroke springs (80) and (81) exhibit a slot, that is pushed into a groove of the valve stem. For reasons of heat expansion the actuation rod (78) or (79) are preferably made of aluminum. A spark plug is shown at (82); it, too, can be housed in one of the cases.

A common cover (83) is provided for the two cases (76) and (77) in which the intake pipe (84). of the cylinder (71) is integrated. The electronics (85) of the drive unit, for example, also for several drives, is attached to the lower panel (84) of the intake pipe. It is insulated against the heat of its own drive by using the heat insulation at (86). Cooling elements (87) of the electronics project into the intake pipe and are optimally cooled by the relatively cook intake air. The cover (83) and the electronics (84) and cooling element (87) can be fastened by a single, common screw (88). A flap (89) that can be opened and closed can be integrated into the cover (83), in order to accommodate alternatively a resonance induction pipe or a oscillation induction pipe.

Figure 7:
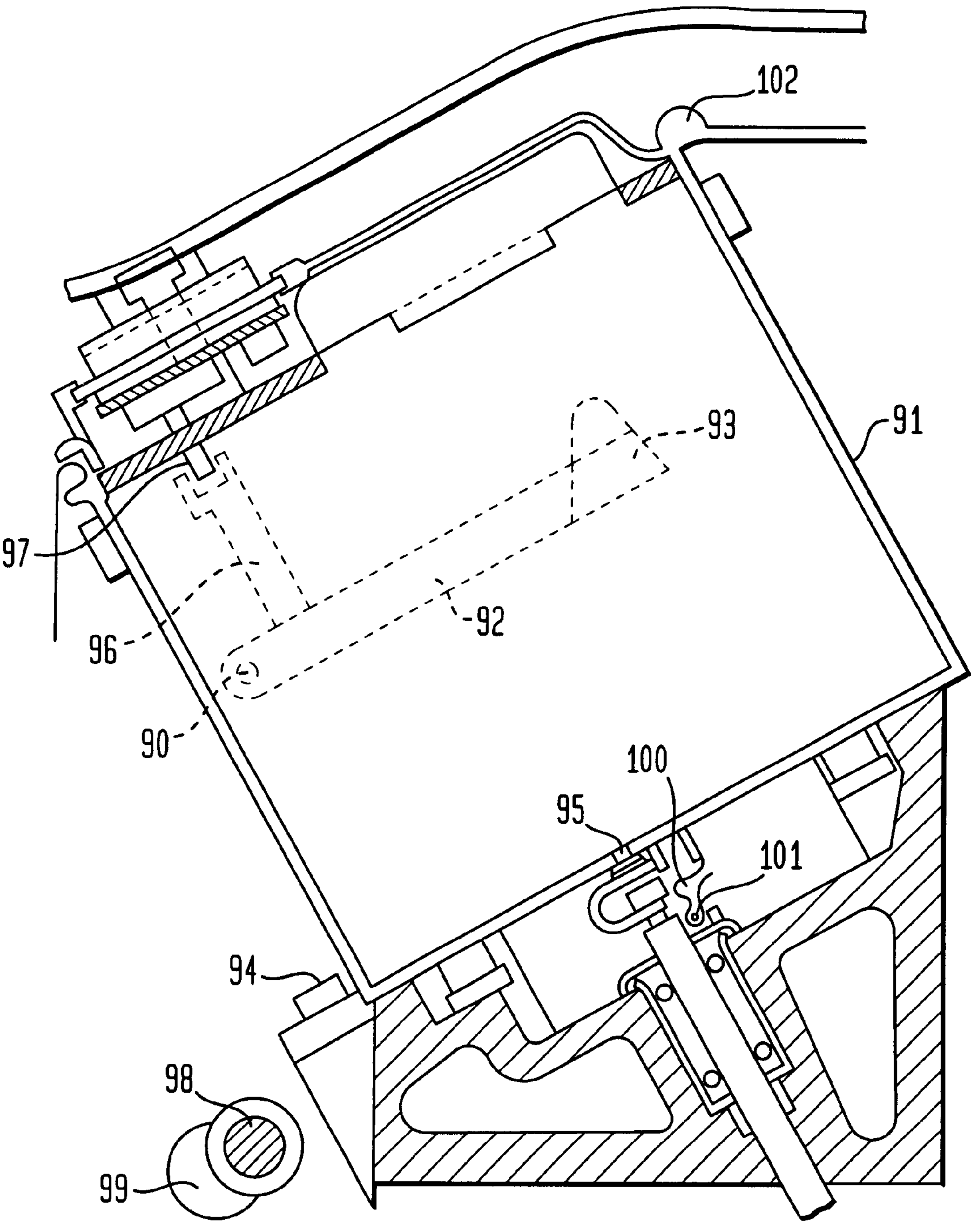

In FIG. 7, which corresponds in essence to the left half of FIG. 6, the torsion bar (90) is shown in the case (91). Shown at the torsion bar, via a connector (92) an armature (93) of an electromagnet, that can be moved up and down by two (not shown) magnets. Shown here are also the screws (94) with which the case (91) is fastened to the cylinder head. The actuation rod (95) (corresponds to 16 of FIG. 1) is fastened to the connector (92) (not visible). The carrier (96) is also connected to it and is part of a stroke sensor (97) (for example, hall-sensor).

FIG. 7 also shows a centering device (98) and in the cylinder block a housing centering device (99). In this way, the valve coupling using the overlift nut can be centered and engage the valve. Here, too, a bosh or stop device (100) is provided that can be rotated around the point (101). It serves as an installation aid. Here, too, the seal (102) between the case and cover is visible.

When discussing housing in a case, then it must be understood that the case is formed merely of various parts on the cylinder block.

By integration of the intake pipe into the cover of the case there is savings in terms of cost and weight. Through the at least partial accommodation of the electronics of the drive unit, or at least its cooling element, in the relatively cool intake pipe on the one hand and the insulation of the electronics the electronics is exposed to only minimal heat stress, which results in an essentially lower failure rate of the electronics components. (arrhenius' law).

A induction pipe with control device can be relatively simply integrated into this configuration.

The electrical connection (switching) of the magnet coils with the electronics is very easy to do in this particular arrangement of the electronics, since all of the contacts can be connected to the circuit board. The stroke sensors can also be accommodated in the electronics (on the board). The possibility of accommodation of the sparkplugs in the case means a "dry" location, whereby the insulation overhead and the required ignition energy is reduced.

What is claimed is:

1. An actuation mechanism comprising: an electromagnetic drive (2, 3, 10) having two electromagnets (2, 3), whose pole surfaces are at least in part facing towards each other, and with an armature (10) that is movable back and forth between these pole surfaces, the armature (10) with deactivated magnets (2, 3) is brought by elastic force (6, 7) into an intermediate position and held there and on activation of one of the electromagnets (2, 3) is brought into a terminal position in the proximity of the pole surfaces of the respective electromagnet (2, 3), whereby the armature (10) is mounted using torsion springs (6, 7) which produce the elastic force at least in part, and acts upon a part (18) to be driven and incorporates at least one drive (2, 3, 10) together with a bearing into a structural unit, and said structural unit is fastened onto a component (20), which contains the part (18) to be driven, and a mounting or carrier element (1*a*), in particular a substantially closed case for accommodating several structural units, said mounting or carrier element (1*a*) is fastened onto the component (20).

2. An actuation mechanism as described in claim 1 characterized by the fact, that the structural component includes the two drives (2, 3, 10) which are mounted on a common foundation or base (1).

3. An actuation mechanism as described in claim 2 characterized by the fact, that the structural component includes the two drives (2, 3, 10) together with their springs (6, 7).

4. An actuation mechanism as described in claim 2 characterized by the fact, that the torsion springs (6, 7) are supported and mounted in the foundation or base (1).

5. An actuation mechanism as described in claim 2 whereby the individual drives each serve to drive a valve of an internal combustion engine, and a valve clearance adjustment screw (17) is provided for the purpose of adjusting the location of the valve relative to the internal combustion engine.

6. An actuation mechanism as described in claim 5 characterized by the fact, that the elastic forces are produced by a torsion bar (6) and a compression spring (19) on the valve.

7. An actuation mechanism as described in claim 6 characterized by the fact, that the two drives (2, 3, 10) act upon one valve.

8. An actuation mechanism as described in claim 7 characterized by the fact, that the carrier element (1*a*) is seated upon a cylinder head (20, 75) of the internal combustion engine, and is connected the engine.

9. An actuation mechanism as described in claim 8 characterized by the fact, that the carrier element (1*a*) exhibits a cover (73) and that an intake pipe (84) of a cylinder of the internal combustion engine is integrated into the cover.

10. An actuation mechanism as described in claim 9 characterized by the fact, that cooling elements (87) to cool the electronics (85) of the drive (2, 3, 10) project into the intake pipe (84).

11. An actuation mechanism as described in claim 8 characterized by the fact, that electronics (85) for actuation of the drive (2, 3, 10) is at least partially arranged in an intake pipe (84) communication air to the cylinder of an internal combustion engine.

12. An actuation mechanism as described in claim 11 characterized by the fact, that the electronics (85) are heat-insulated with respect to the drives (2, 3, 10) by insulation (86).

13. An actuation mechanism as described in claim 11 characterized by the fact, that at least one spark plug is accommodated in the carrier element (1*a*).

14. An actuation mechanism as described in claim 8 characterized by the fact, that the part (18) to be driven is made of aluminum.

15. An actuation mechanism as described in claim 8 characterized by the fact, that the valve exhibits a bosh or stop device (100) as a mounting aid.

16. An actuation mechanism as described in claim 7 characterized by the fact, that the carrier element has a centering device (98) and is provided with a centering (99) for the carrier element relative to the cylinder block of the internal combustion engine.

17. An actuation mechanism as described in claim 7 characterized by the fact, that an induction pipe with a controller (89) is integrated into a cover unit (83) that encloses two or more carrier elements (1*a*).

18. An actuation mechanism as described in claim 17 characterized by the fact, that the cover unit (83) is fastened with screws (88) to the carrier elements (1*a*).

19. An actuation mechanism as described in claim 2, whereby the individual drives serve to drive a valve of an internal combustion engine, and characterized by the fact, that each structural unit is adjustable by means of an adjustment device (30, 30*a*) for the purpose of location of the valve relative to the internal combustion engine.

20. An actuation mechanism as described in claim 19 characterized by the fact, that the electromagnet (3) is adjustable for the purpose of adjustment of the location of the valve.

21. An actuation mechanism as described in claim 20 characterized by the fact, that the electromagnet (3), in particular via a lever as its connection element, is mounted as unilaterally joined and adjustable rotationally around as axis.

22. An actuation mechanism as described in claim 20 characterized by the fact, that the electromagnet (3) is rotationally adjustable around an axis by way of a cam or screw mechanism.

23. An actuation mechanism as described in claim 19 characterized by the fact, that the electromagnet (3) includes electrical winding (20) in contact with the foundation or base (1).

24. An actuation mechanism as described in claim 23 characterized by the fact, that the two drives (2, 3, 10) drive one valve.

25. An actuation mechanism as described in claim 24 characterized by the fact, that the torsion springs (46, 47) are tensioned at one end in carrier plates (42, 19) and at the other free ends are connected to an armature lever (49) forming a connection with the armature (10) and that the carrier plates (42, 19), the torsion springs (46, 47) and the armature lever (49) form an installation unit, which is fastened tensionally on the structural component.

26. An actuation mechanism as described in claim 25 characterized by the fact, that the free end of the torsion springs (46, 47) exhibit a bracket (50).

27. An actuation mechanism as described in claim 26 characterized by the fact, that the mounting is a needle bearing.

28. An actuation mechanism as described in claim 25 characterized by the fact, that the torsion springs (46, 47) are welded to the carrier plates (42, 19) and the armature lever (49).

29. An actuation mechanism as described in claim 25 characterized by the fact, that the torsion springs (46, 47) are connected to the carrier plate and the armature lever by appropriate devices via form-locking or tensional connections.

30. An actuation mechanism as described in claim 1 characterized by the fact, that the electromagnets (2, 3) are fastened to the foundation or base (1) using screws (4) or bolts and the residual air gap setting is done by adjustment of the electromagnet drive prior to fastening.

31. An actuation mechanism as described in claim 1 characterized by the fact, that the torsion springs (6, 7) are arranged at approximately equal height next to each other.

32. An actuation mechanism as described in claim 1 wherein said part (18) comprises two members (16, 18) that are interconnected by a plug connector jack (21).

* * * * *